United States Patent [19]

Rideout

[11] 4,075,045
[45] Feb. 21, 1978

[54] METHOD FOR FABRICATING FET ONE-DEVICE MEMORY CELLS WITH TWO LAYERS OF POLYCRYSTALLINE SILICON AND FABRICATION OF INTEGRATED CIRCUITS CONTAINING ARRAYS OF THE MEMORY CELLS CHARGE STORAGE CAPACITORS UTILIZING FIVE BASIC PATTERN DELIBERATING STEPS

[75] Inventor: Vincent L. Rideout, Mohegan Lake, N.Y.

[73] Assignee: International Business Machines Corporation, Armonk, N.Y.

[21] Appl. No.: 656,756

[22] Filed: Feb. 9, 1976

[51] Int. Cl.² .................. H01L 21/22; H01L 21/31; H01L 29/78
[52] U.S. Cl. .................................. 148/187; 29/571; 29/578; 148/1.5; 156/652; 156/653; 156/657; 357/23; 357/41; 357/51; 357/59; 427/86; 427/88; 427/93
[58] Field of Search ............... 148/1.5, 187; 29/571, 29/578; 156/17, 652, 653, 657; 357/41, 23, 51, 59; 427/86, 88, 93

[56] References Cited

U.S. PATENT DOCUMENTS

| | | | |
|---|---|---|---|
| 3,387,286 | 6/1968 | Dennard | 147/187 X |
| 3,811,076 | 5/1974 | Smith | 357/41 |
| 3,834,959 | 9/1974 | Dennard et al. | 29/576 X |
| 3,841,926 | 10/1974 | Garnache et al. | 148/187 X |
| 3,865,652 | 2/1975 | Agusta et al. | 148/187 |
| 3,897,282 | 7/1975 | White | 148/175 |
| 3,899,363 | 8/1975 | Dennard et al. | 148/1.5 |
| 3,958,323 | 5/1976 | De la Moneda | 29/571 |

OTHER PUBLICATIONS

Rideout, V.L., "Masking for —Metal–to–Polysilicon Contacts" I.B.M. Tech. Discl. Bull., vol. 17, No. 9, Feb. 1975, pp. 2802–2804.

Primary Examiner—L. Dewayne Rutledge
Assistant Examiner—W. G. Saba
Attorney, Agent, or Firm—Pollock, Vande Sande & Priddy

[57] ABSTRACT

Fabricating an integrated circuit array of FET one-device memory cells which includes providing a semiconductive substrate of a first conductive type; delineating field insulation regions; delineating polycrystalline silicon gate regions employing an oxidation barrier masking layer; introducing active impurities of a second and opposite conductive type into predetermined regions of the substrate to provide doped bit lines (FET drains), connection regions (FET sources), and lower conductive electrodes of the storage capacitors; next delineating upper polycrystalline silicon electrodes of the storage capacitors; growing silicon dioxide insulation over all portions of the structure except over the FET gate regions which are protected by the oxidation barrier masking layer; removing the oxidation barrier masking layer over the FET gates with an etchant; delineating contact holes to polycrystalline silicon capacitor electrodes and to FET sources and drains in circuits peripheral to the array of memory cells; and delineating the metallic-type high-conductivity electrical interconnection word line pattern. This fabrication procedure requires five basic lithographic (pattern delineating) masking steps. A high electrical conductivity word line is electrically connected to the gate of the FET by means of a "self-registering" metallic line to polysilicon gate contact. This gate contacting technique is relatively more tolerant to misregistration between the FET gate lithographic pattern and the metallic interconnection line lithographic pattern than are previously known fabrication methods.

25 Claims, 17 Drawing Figures

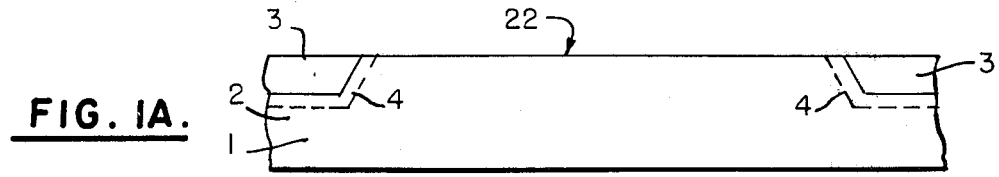
FIG. IA.
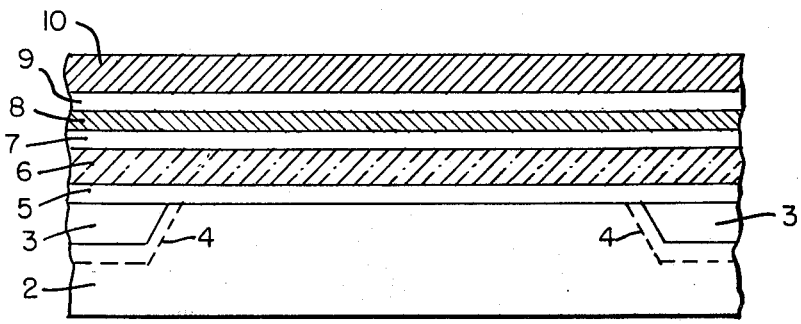
FIG. IB.
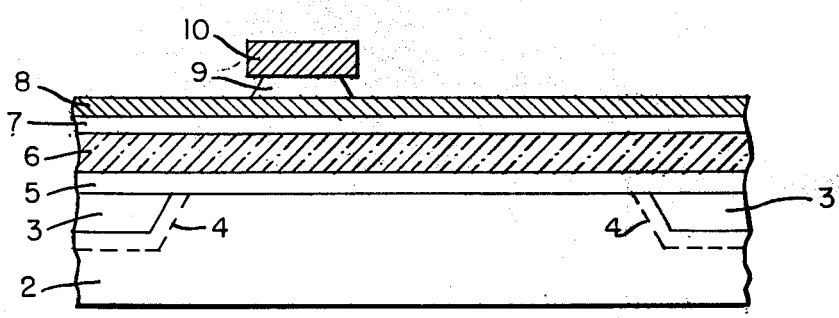
FIG. IC.
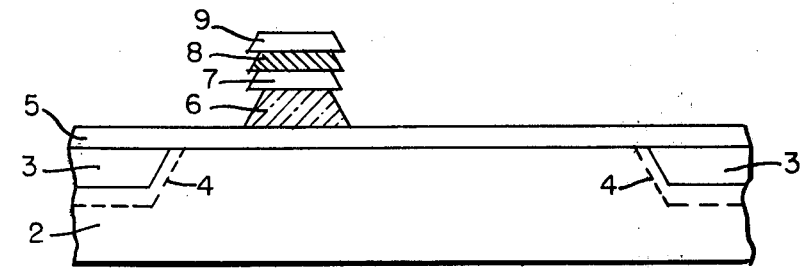
FIG. ID.
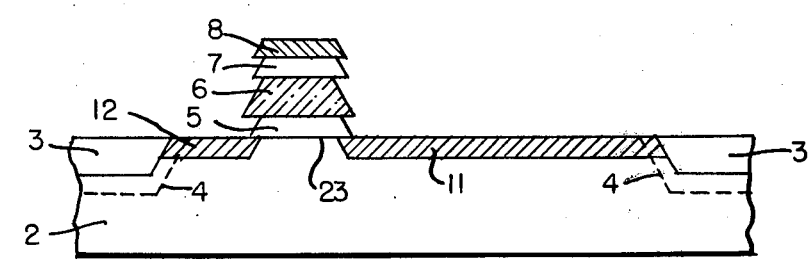
FIG. IE.

METHOD FOR FABRICATING FET ONE-DEVICE MEMORY CELLS WITH TWO LAYERS OF POLYCRYSTALLINE SILICON AND FABRICATION OF INTEGRATED CIRCUITS CONTAINING ARRAYS OF THE MEMORY CELLS CHARGE STORAGE CAPACITORS UTILIZING FIVE BASIC PATTERN DELIBERATING STEPS

BACKGROUND OF THE INVENTION

The present invention relates generally to n-channel FET one-device memory cells of minimum dimensions, and the preparation of integrated circuits containing arrays of these cells. More particularly, the present invention relates to n-channel FET one-device memory cells which employ two separately deposited and separately delineated polycrystalline silicon (i.e., polysilicon) layers wherein one of the layers provides the gate of the FET and the other layer provides the upper electrode of the charge storage capacitor, and the preparation of integrated circuit arrays of these cells. The lower electrode of the charge storage capacitor is a semiconductive region of n-conductive type upon which charge representing information can be stored. The present invention provides FET memory cells which have a self-registering electrical connection between the metallic interconnection word line and the polysilicon gate of the FET. Moreover, the present invention is directed to what is commonly referred to as "metal word line/diffused bit line" memory cell arrays as distinguished from "metal bit line/polysilicon word line" memory cell arrays. The present invention requires only five basic lithographic (pattern delineating) masking steps to achieve the desired integrated circuit comprising an array of one-device memory cells and the associated addressing, decoding, and sensing circuits which are positioned peripherally to the array.

The FET one-transistor-per-memory-cell (one-device memory cell) represents the most densely packed, highest performance, integrated circuit, random access memory device available on the market today. Such semiconductor memories use the so-called "one-device cell" which consists of a single field-effect transistor (FET) switch and a conductor-insulator-semiconductor information storage capacitor. The FET is used to switch electronic charges (electrons) representing information into and out of the capacitor. Typically the charge storage capacitor is operated in two states, charged and uncharged, representing a binary "1" and "0". The upper electrode of the storage capacitor can be referred to as the plate of the one-device cell.

Various methods are known in the art for preparing integrated circuit arrays of FET one-device memory cells having metal word lines and diffused bit lines. One of the first of this type of one-device memory cell known was a metal gate/metal plate cell with a doped storage region described by Dennard in U.S. Pat. No. 3,387,286. Arrays of this type of device require four basic masking steps, but the cells are relatively very large in area because the metal gate word line cannot pass over the metal storage capacitor plate.

Smith in U.S. Pat. No. 3,811,076 and Garnache et al in U.S. Pat. No. 3,841,926 describe four mask methods for fabricating an integrated circuit array of one-device memory cells which employ a metal gate, and a polysilicon storage electrode which also serves as a field shield for isolation between cells. The fabrication processes suggested by Smith and by Garnache et al make it possible to obtain high density memory cells with doped storage regions. However, the fabrication methods and subsequent cells disclosed by Smith and by Garnache et al require that the field shield overlap the bit line thereby resulting in a relatively high capacitive coupling between the bit line and the field shield (storage plate) which for best circuit performance should be as low as possible.

In addition, Dennard, Rideout, and Walker in U.S. Pat. No. 3,899,363 illustrate the fabrication of one-device memory cells utilizing recessed oxide isolation regions for electrically insulating one cell from another in a densely packed integrated circuit array. The fabrication method suggested by Dennard et al employs four basic masking steps and utilizes one layer of polysilicon. However, the devices obtained by such a process are relatively large as compared to the devices achieved by the process of the present invention because they require a conventional etched contact hole in order to electrically connect the metallic word line to the polysilicon gate. The contact hole is etched through an insulating oxide layer that exists over the polysilicon gate. Furthermore, the storage region is provided by an inversion layer as opposed to a doped storage electrode as obtained by the present invention.

Inversion storage is not entirely desirable because it requires an additional power supply for the upper capacitor electrode to maintain the inversion layer. Generally, the voltage supplied to the upper capacitor electrode is larger in absolute magnitude than the voltage supplied to the word line, and different in polarity from that supplied to the semiconductive substrate. Furthermore, in an inversion storage device, a pin hole in the storage capacitor insulator can cause a deleterious high leakage current due to the required difference in supply voltages between the upper storage capacitor electrode and the semiconductive substrate.

With a doped storage device there is no need to provide a power supply to maintain an inversion layer because the doped region provides the necessary electrons. Consequently, the upper storage electrode can be maintained at the same voltage as the substrate. Not only does this eliminate one power supply, but, in addition, pinholes in the capacitor insulator do not cause a deleterious high leakage current because the upper storage capacitor electrode and the semiconductive substrate are maintained at the same voltage.

Exemplary of still another fabrication method for an integrated circuit array of one-device memory cells is that described by Dennard et al in U.S. Pat. No. 3,834,959 which involves a metal gate such as an aluminum gate and a polysilicon storage plate. This technique results in a thick recessed silicon-dioxide isolation between adjacent cells and requires five basic masking steps. The storage method, however, is inversion storage and, accordingly, is not entirely desirable for reasons discussed hereinabove.

A fabrication process suggested by Kalter and Miller in IBM Technical Disclosure Bulletin, Volume 14, No. 10, March 1972, provides polysilicon gate FETs in which a metal word line is "self-registered" with respect to a polysilicon gate. In the fabrication process disclosed by Kalter et al, oxidation over the polysilicon gate is prevented by an oxidation barrier gate masking layer. When the oxidation barrier layer is removed, the entire gate area is revealed for contacting. A metal word line such as aluminum that crosses the polysilicon gate will provide an electrical connection to that gate.

Because the entire gate area is revealed, the metal word line and the polysilicon gate advantageously do not need to be precisely registered with respect to each other in order to make electrical connection. Much more precise registration is required, however, when the metal line must contact the polysilicon gate via a conventional contact hole etched through an oxide layer that exists over the gate. However, the process suggested by Kalter et al requires an inversion storage under the capacitor plate and, accordingly, is therefore not completely satisfactory.

Also, the inventor of the present application suggested, for instance, in IBM Technical Disclosure Bulletin, Vol. 17, No. 9, February 1975, a fabrication process involving five basic masking steps to provide integrated circuits of relatively small one-device memory cells having thick oxide isolation between cells and a self-registering connection between a conductive word line and a polysilicon gate. However, this fabrication process, which employs five basic lithographic masking steps, utilized a single layer of polysilicon which results in inversion storage beneath the capacitor and is therefore not completely satisfactory.

In the fabrication of FET one-device memory cells it is desirable to use polysilicon for both the gate of the FET switch and the plate of the storage capacitor. As is well known in the art, polysilicon is an attractive FET gate material because of its ability to withstand high processing temperatures without degradation, which allows fabrication of source and drain self-aligned with respect to the gate. Furthermore, polysilicon offers potentially higher gate oxide reliability than other gate materials. Electrical insulation layers can be deposited or grown on polysilicon capacitor plates, which allows another interconnection material to cross over them, thereby facilitating the internal on-chip wiring of integrated circuits. In addition, polysilicon can serve as an interconnection material.

Accordingly, the prior art suggestions including the five masking step processes do not provide integrated circuits of one-device memory cells having all of the following desirable aspects:

(1) doped polysilicon gate;
(2) doped polysilicon upper storage capacitor electrode (plate);
(3) doped lower storage capacitor electrode;
(4) thick oxide isolation between memory cells of the array;
(5) self-registering electrical connection between the doped polysilicon gate and the metallic-type high-conductivity word line;
(6) doped bit line.

The lithographic masking steps involved in preparing integrated circuits are among the most critical. The lithographic masking steps require high precision in registration and extreme care in execution. Each additional lithographic masking step in a process introduces possible surface damage due to mask defects, and increases mask-to-mask registration problems that decrease the processing yield and, accordingly, significantly increase the fabrication cost. Although other factors affect the yield and cost such as, for example, the number of high temperature heat treatments, a basic objective in all FET integrated circuit fabrication is to minimize the number of basic lithographic masking steps required to produce a particular integrated circuit array of desired device structures.

Accordingly, an object of the present invention is to provide FET one-device cell memories having all of the above-discussed desirable aspects. Another object of the present invention is to provide a fabrication process for producing integrated circuits of FET one-device memory cells which requires a minimum number of masking steps. In particular, it is an object of the present invention to provide a fabrication process which requires only five basic lithographic masking steps in order to prepare integrated circuits containing arrays of one-device memory cells having all of the following desirable characteristics:

(1) doped polysilicon gate;
(2) doped polysilicon upper capacitor electrode (plate);
(3) doped lower capacitor electrode;
(4) thick field oxide isolation between memory cells of the array;
(5) self-registering electrical connection between the doped polysilicon gate and the metallic-type high-conductivity word line;
(6) doped bit line.

The present fabrication process which employs only five lithographic masking steps is relatively easy to perform and does not to any great extent increase the overall processing time and expense over prior art processes employing five masking steps. Such prior art processes do not produce the desirable integrated circuit memory cell arrays achieved by the present invention.

SUMMARY OF THE INVENTION

The present invention is directed to certain FET one-device memory cells and to a method for fabricating a semiconductor, integrated-circuit, random-access memory comprising a semiconductive substrate having at least one such FET formed therein. Each FET has source, drain, and channel regions and each FET in a memory cell is electrically connected to a charge storage capacitor. In a memory cell the FET acts as a switch to charge or discharge the capacitor. The presence or absence of charge on the storage capacitor represents information.

The FET and the capacitor comprising the memory cell are surrounded by a relatively thick oxide isolation region, commonly referred to as the field oxide. The field oxide electrically isolates one FET switch and its associated storage capacitor from other like memory cell units which are present on the same substrate. This field oxide may be formed by thermal oxidation of the semiconductive substrate or by well known vacuum or chemical vapor deposition techniques. The field oxide may be formed on the surface of the semiconductive substrate or it may be partially or fully recessed into the semiconductive substrate such as described by Dennard, Rideout, and Walker in U.S. Pat. No. 3,899,363.

The gate of the FET and the upper conductive electrode (plate) of the capacitor are of polysilicon. The gate and the plate are separately deposited and are fabricated sequentially in separate lithographic masking steps so that an oxidation barrier masking layer can be preserved above the polysilicon gate and also so that a doped semiconductive layer connecting to the source region of the FET can be provided beneath the polysilicon (upper) capacitor electrode thereby forming the other (lower) electrode of the capacitor.

In order to form an array of randomly addressable memory cells, electrically conductive lines are connected to each FET gate in the array of memory cells. These lines must cross over and be electrically insulated from the polysilicon (upper) capacitor electrodes, and from the source and drain regions of the FETs in the array. This is achieved by thermally growing a silicon dioxide layer over the polysilicon capacitor electrode and over all other areas of the structure except for the gate regions which are protected by the oxidation barrier layer. Subsequently removing the oxidation barrier layer from the gate leads to a "self-registering" gate contact to the electrically conductive word line. The other access line of the array is formed by extending the drain of the FET. In fact, all of the drains in one direction are connected together to form a doped bit line. In this manner, one-device memory cells can be connected into a randomly addressable array. In order to select the address of, read information into, or write information out of a memory cell; addressing, decoding, and sensing circuits are provided peripheral to the array of memory cells. As is well known in the state of the art, such FET circuits are generally fabricated on the same integrated circuit chip and with the same fabrication process as is used for the array of memory cells.

In particular, the present invention is directed to a method for fabricating an integrated circuit containing an array of FET one-device memory cells wherein the cells have a doped bit line; a doped polysilicon FET gate with a self-registering connection to a metallic-type high electrically conductive word line; a doped polysilicon (upper) capacitor electrode; thick oxide isolation between cells; and a doped (lower) capacitor electrode beneath the polysilicon electrode which comprises:

(A) providing a semiconductive substrate of p-conductive type containing active impurities of p-type;

(B) providing and delineating predetermined oxide regions above or recessed into the substrate to provide isolating field oxide regions between memory cells of the array;

(C) providing an FET gate insulator;

(D) depositing and doping a layer of polycrystalline silicon above the gate insulator;

(E) then delineating the predetermined polycrystalline silicon gate regions of the FETs with an oxidation barrier layer;

(F) thermally diffusing or ion implanting active impurities of n-type into predetermined regions of the semiconductive substrate to provide doped bit lines (FET drains), connection regions (FET sources), and lower silicon electrodes of the storage capacitors above which electrodes are to be subsequently delineated polycrystalline silicon upper electrodes of the storage capacitors;

(G) providing a capacitor insulator;

(H) then depositing and doping a second and subsequent layer of polycrystalline silicon above the capacitor insulator;

(I) then delineating the second and subsequent polycrystalline silicon layer to provide predetermined polycrystalline silicon upper electrode regions above the corresponding n-type doped silicon lower electrodes of the storage capacitors;

(J) thermally growing a silicon dioxide insulating layer over regions of the structure but not over the polycrystalline silicon FET gates which are still protected by an oxidation barrier layer;

(K) removing the oxidation barrier layer from over the FET gates by use of an etchant;

(L) delineating contact holes to polycrystalline silicon upper capacitor electrodes; and to n-type source and drain regions in circuits peripheral to the array of memory cells;

(M) next depositing and delineating a metallic-type high-conductivity electrical interconnection pattern that makes electrical connection to the polycrystalline silicon FET gates in the array of memory cells; to polycrystalline silicon upper capacitor electrodes; and to FET sources, gates, and drains in circuits peripheral to the array of memory cells.

The particular sequence of fabrication steps of the present invention makes it possible to provide the desired array of FET one-device memory cells of minimal dimensions and the peripheral circuits with only five basic lithographic masking steps. The five basic lithographic masking fabrication steps required by the present invention are as follows:

(1) delineating field area and device area pattern;

(2) delineating FET gate pattern;

(3) delineating upper storage capacitor electrode pattern;

(4) delineating contact hole pattern to provide vias to upper capacitor electrode and to n-type source and drain regions;

(5) delineating high-conductivity interconnective line pattern.

The contact hole or vias referred to in step (4) above do not appear in the array of memory cells but rather appear in circuits peripheral to the array of memory cells.

The present invention is also directed to integrated circuits obtained by the above-discussed process.

Another aspect of the present invention is concerned with an FET one-device memory cell containing;

(A) semiconductive substrate of p-conductive type containing active impurities of p-type;

(B) doped polycrystalline silicon FET gate;

(C) doped polycrystalline silicon upper storage capacitor electrode;

(D) doped n-conductive type lower storage capacitor electrode;

(E) doped n-conductive type bit line;

(F) metallic-type high-conductivity word line;

(G) self-registering electrical connection between the doped polycrystalline silicon gate and the word line;

(H) oxide isolation between said memory cell and other memory cells on the same semiconductive substrate; and (I) silicon dioxide insulation over regions of the structure but not over the FET gates.

The present invention is also concerned with integrated circuit arrays containing a plurality of the above defined FET one-device memory cells.

BRIEF DESCRIPTION OF THE DRAWINGS

FIGS. 1A–1J are cross-sectional views of an FET one-device memory cell in various stages of fabrication.

FIG. 2E shows a top view of one polysilicon-gate/-polysilicon-plate FET one-device memory cell made using the self-registered gate contact technique employed in the present invention.

FIGS. 1A–1H and 1J show cross-sectional views through the center of the FET one-device memory cell along line aa' of FIGS. 2A–2E. FIG. 1I shows a cross-sectional view through the contact holes or vias along line bb' of FIG. 2D.

DESCRIPTION OF PREFERRED EMBODIMENTS

For convenience, the discussion of the fabrication steps is directed to the preferred aspect of employing a p-type silicon substrate as the semiconductive substrate and an n-type impurities as the diffused or implanted dopant impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic type interconnection lines" or "high-conductivity interconnection lines" refer to metal lines such as aluminum as well as to non-metallic materials (e.g., highly doped polysilicon or intermetallic silicides) which nevertheless can have conductivities of the magnitude generally possessed by conductive metals. Moreover, the terms "polysilicon" and "polycrystalline silicon" used herein interchangeably as in the prior art. Furthermore, the terms "oxide" and "silicon dioxide" are used herein interchangeably as in the prior art. Also, when reference is made to impurities of a "first type" and to impurities of the "second type", it is understood that the "first type" refers to n or p-type impurities and "second type" refers to the opposite conductivity type. That is, if the "first type" is p, then the "second type" is n. If the "first type" is n, then the "second type" is p.

Referring to FIG. 1A, there is shown a fragment of the initial structure of the invention generally shown as 1. A p-type silicon substrate 2 having any desired crystal orientation (e.g., <100>) is prepared by slicing and polishing a p-type silicon boule grown in the presence of a p-type dopant such as boron following conventional crystal growth techniques. Other p-type dopants for silicon include aluminum, gallium, and indium.

As discussed hereinabove, the field oxide isolation can be fabricated by any of several known procedures including thermal oxidation of the semiconductor substrate or by well known vacuum or chemical vapor deposition techniques. Furthermore, the field oxide may be formed above the semiconductive surface or it may be partially or fully recessed into the semiconductive substrate. An example of one such procedure is the fully recessed oxide isolation technique disclosed in U.S. Pat. No. 3,899,363, disclosure of which is incorporated herein by reference. For the purpose of illustration of the five-masking step procedure of the present invention, a fully recessed field isolation oxide will be used.

Figure 1F:
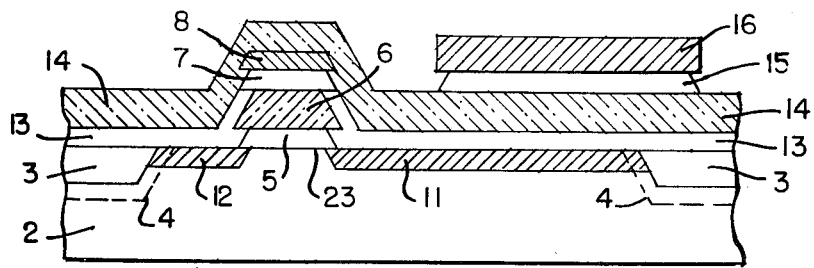
Figure 2A:
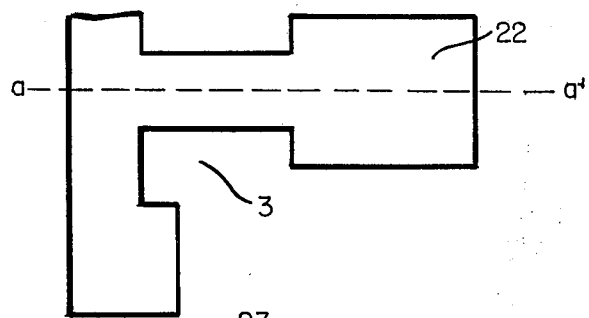
FIGS. 2A–2E show a top view of the five basic lithographic masks employed according to the present invention.

FIG. 1A shows the recessed field oxide regions 3 and their associated implanted p-type channel stopper regions 4 fabricated following the technique disclosed in U.S. Pat. No. 3,899,363. The field oxide isolation regions are about 4000 to 10,000 A thick and are fully recessed with respect to the silicon surface. The lithographic mask shown in FIG. 2A is used to delineate the field oxide regions 3 and the device regions 22. This is the first basic lithographic masking step. The mask is of a transparent material having opaque portions in a predetermined pattern.

A thin gate insulator layer of silicon dioxide 5 is grown on or deposited onto the silicon substrate 2. This gate insulator, which is about 200 to 1000 A thick, is preferably formed by thermal oxidation of the silicon surface at 1000° C in the presence of dry oxygen.

A layer of polycrystalline silicon 6 is then deposited. The polysilicon layer is approximately 1500 to 5000 A thick, and may be formed by chemical-vapor deposition. The polysilicon layer is now doped with an n-type dopant such as arsenic, phosphorus, or antimony by one of several conventional techniques. Preferably, the polysilicon is doped with phosphorus and preferably uses the technique of depositing a $POCl_3$ layer and heating it to approximately 870° C to drive the phosphorus into the polysilicon making it n-type. After this, the residual of the $POCl_3$ layer is removed by etching the wafer in buffered hydrofluoric acid. A thin surface protection layer of silicon dioxide 7 about 50 to 200 A thick is grown on or deposited onto the polysilicon layer to prevent a subsequently deposited oxidation barrier layer 8 from reacting with the polysilicon and thereby rendering it difficult to later remove the oxidation barrier layer.

An adherent oxidation barrier layer 8 of a non-oxidizing material such as silicon nitride, aluminum nitride, boron nitride, aluminum oxide, or silicon carbide is then deposited. Preferably the layer 8 is of silicon nitride and is approximately 500 to 1000 A thick. The layer 8 may be deposited by conventional chemical-vapor deposition techniques. An additional layer of silicon dioxide 9 is then deposited. The silicon dioxide layer 9 is approximately 500 to 1000 A thick and may be formed by chemical-vapor deposition. This layer 9 serves as an etching mask to delineate the layer 8.

The layer 8 serves as an etching mask to delineate the gate pattern into the silicon-dioxide layer 7, and as an oxidation barrier layer during subsequent growth of the insulation oxide over other parts of the stucture. The oxidation barrier layer material should not oxidize, or at most only oxidize extremely slowly relative to the oxidation rate of silicon and polysilicon. The oxidation barrier layer material is considered to be a nonoxidizing material under the conditions to which it is subjected in the method of the present invention. The oxidation barrier layer 8 is preferably a nitride such as silicon nitride and it prevents oxidation of the polysilicon gate 6 thereunder.

A gate pattern determining layer such as a layer of resist material 10 of the type employed in known lithographic masking and etching techniques is placed over the surface of the upper oxide layer 9. Any of the well-known photosensitive polymerizable resist materials known in the art may be used. The resist material is applied as by spinning on or by spraying. The resultant structure is shown in FIG. 1B.

Figure 2B:
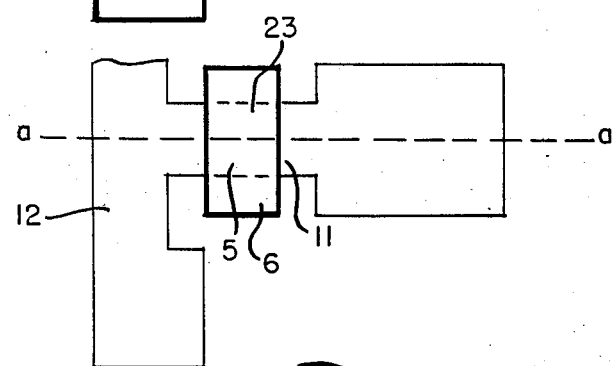

The layer of photoresist material 10 is dried and then selectively exposed to ultraviolet radiation through a photolithographic mask (see FIG. 2B). This mask is of a transparent material having opaque portions in a predetermined pattern. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired pattern, i.e., it covers the regions in which the polysilicon gate regions will subsequently be formed.

Next the structure is treated to remove the portions of the silicon dioxide 9 not protected by the resist material 10. The wafer is immersed in a solution of buffered hydrofluoric acid. The etching solution dissolves silicon dioxide but does not attack the resist, oxidation barrier layer 8 such as silicon nitride, or other materials of the assembly, as illustrated by FIG. 1C.

The photoresist material 10 above the etched silicon dioxide 9 is then removed by dissolving in a suitable solvent. The remaining silicon dioxide regions 9 conform to a predetermined pattern, and now serve as a mask for etching predetermined patterns in the oxidation barrier layer 8. Layer 8 then serves as a mask for etching patterns in the thin oxide layer 7, and layer 7 then serves as a mask for etching patterns in the polysilicon layer 6.

Patterns in the layer 8, when silicon nitride is employed, can be formed by etching in a phosphoric acid solution at 180° C. Patterns in the thin oxide layer 7 are formed by etching in a solution of buffered hydrofluoric acid. Patterns in the polysilicon layer 6 are formed by etching in a wellknown etchant such as ethylene diamine pyrocatechol at 100° C. This completes the second basic lithographic masking step which delineates the FET gate pattern illustrated in FIG. 1D and FIG. 2B.

The n-type source and drain regions are now formed by well-known ion implantation or diffusion techniques. For purposes of illustrating the present invention, ion implantation has been selected. For instance, the n-type source and drain regions 11 and 12, respectively, can be formed 2000 A deep by an $As^{75}$ implant of about 100 KeV energy and $4 \times 10^{15}$ atoms/cm$^2$ dose. During implantation, the polysilicon gate 6, the silicon-dioxide layer 7, and the oxidation barrier layer 8 act as a blocking mask to prevent n-type dopant impurities from entering the FET channel region 23 under the polysilicon gate 6. The thick field oxide 3 acts as a blocking mask to prevent n-type impurities from entering the field isolation regions.

The boundaries between the n-type source and drain regions and the channel of the FET are determined by the polysilicon gate. This is generally referred to in the prior art as the "self-aligned gate technique". With the gate self-aligned to the source and drain, the parasitic gate to source and drain overlap capacitances are advantageously reduced over other FET fabrication techniques.

Next, the portions of thin oxide layer 5 through which the implant passed (i.e., those portions not under the polysilicon gate) are removed by etching in a solution of buffered hydrofluoric acid. The etchant also removes all or most of oxide layer 9. Any part of layer 9 not removed can be removed at a later step by a short time or "dip" etch in buffered hydrofluoric acid. The resultant FET structure is shown in FIG. 1E. Although it is generally preferable to implant through thin layer 5 and then remove it, the layer 5 can be removed prior to the implanting or retained through the entire process, as desired.

Next, a thin storage capacitor insulator layer 13 is formed. The insulator layer is grown on or deposited onto the assembly. This storage capacitor insulator, which is approximately 200 to 1000 A thick, is preferably of silicon dioxide and is formed by thermal oxidation of the assembly at 1000° C in the presence of dry oxygen.

An advantage of the present invention is that the gate insulator layer 5 and the storage capacitor insulator layer 13 can be of different thicknesses. For instance, it may be desirable to make the storage capacitor insulator thinner than the gate insulator in order to increase the capacitance of the storage capacitor; whereas, the gate insulator could be thicker to prevent breakdown due to the voltages experienced by the gate insulator during operation. The polysilicon gate is generally n-type; whereas, the polysilicon upper capacitor electrode can be either p- or n-type, but preferably is also n-type.

A second layer of polysilicon 14 is then deposited over the entire structure. The polysilicon layer is approximately 3500 to 5000 A thick and may be formed by chemical-vapor deposition. The polysilicon is doped with POCl$_3$ as described hereinabove. After doping, a layer 15 of silicon dioxide 500 to 1000 A thick is grown on or is deposited onto the second polysilicon layer. Preferably the silicon dioxide is deposited by conventional chemical-vapor deposition techniques. The residual of the POCl$_3$ layer need not be removed prior to forming the silicon dioxide 15.

The n-type source, drain, and lower capacitor electrode are formed by ion implantation or diffusion after delineating the polysilicon gate, but before delineating the polysilicon upper capacitor electrode (plate). The ion implantation or thermal diffusion must be carried out before the step of depositing the second polysilicon layer in order to form an n-type lower capacitor electrode under the polysilicon capacitor upper electrode.

A layer of resist material 16 of the type described previously for defining the gate pattern is now used to define the polysilicon upper capacitor electrode (plate) pattern. The resist material 16 is applied, exposed with UV radiation using a predetermined lithographic mask pattrn shown in FIG. 2C, and the unexposed regions of the resist are dissolved away. This is the third basic lithographic masking step. Next, the structure is treated to remove the portions of the silicon dioxide 15 not protected by the resist material 16 as illustrated by FIG. 1F.

Figure 1G:
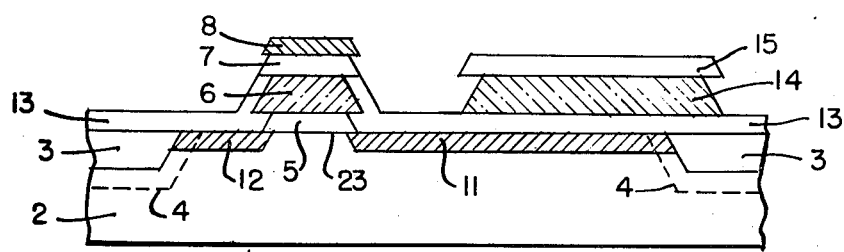
Figure 2C:
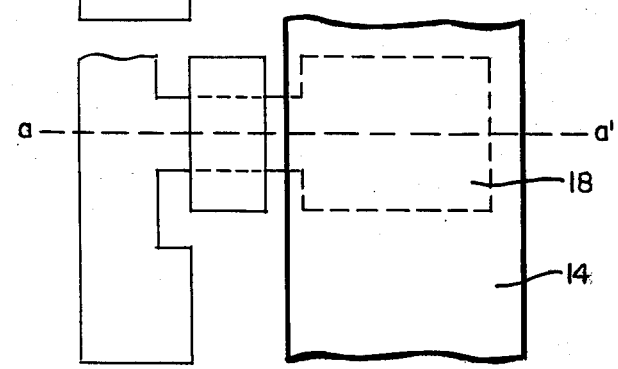

The wafer is immersed in a solution of buffered hydrofluoric acid which dissolves silicon dioxide layer 15 but does not attack resist, oxidation barrier layer such as silicon nitride, silicon, or other materials of the assembly. The remaining photoresist 16 above the etched silicon dioxide pattern 15 is then removed by dissolving in a suitable solvent. The remaining silicon dioxide conforms to a predetermined capacitor storage plate pattern as shown in FIG. 2C. The patterns in the polysilicon plate layer 14 are formed by etching in a wellknown etchant such as ethylene diamine pyrocatechol at 100° C. The etchant does not attack the polysilicon gate regions which are covered on the sides with a protective layer of silicon dioxide 13 and on the top with an oxidation barrier layer 8 and oxide layer 7 as shown in FIG. 1G, because the etchant does not attack silicon dioxide or silicon nitride. The defining layer of silicon dioxide 15 over the polysilicon plate regions is preferably retained since it enhances the thickness of the dielectric insulation over the plate as illustrated by FIG. 1G.

If desired, an additional n-type implantation or diffusion may be performed at this time to increase the electrically conductivity of the source regions and of the drain regions (n-type bit lines). If utilized, this additional n-type doping will not enhance the conductivity of the lower electrode 18 of the capacitor due to the blocking action of the polysilicon upper capacitor electrode 14 and silicon dioxide layer 15.

It is noted that the polysilicon plate 14, when desired, can be spaced arbitrarily close or even overlap onto the polysilicon gate 6 because regions 14 and 6 are formed in separate lithographic steps. This leads to a memory cell which is relatively smaller than the five-mask inversion cells disclosed by Kalter and Miller in the IBM Technical Disclosure Bulletin, referred to hereinabove, in which the gate and plate are defined in a single lithographic masking step and from a single layer of polysilicon and must, therefore, be separated by at least one minimum exposable line-spacing dimension.

Figure 1H:
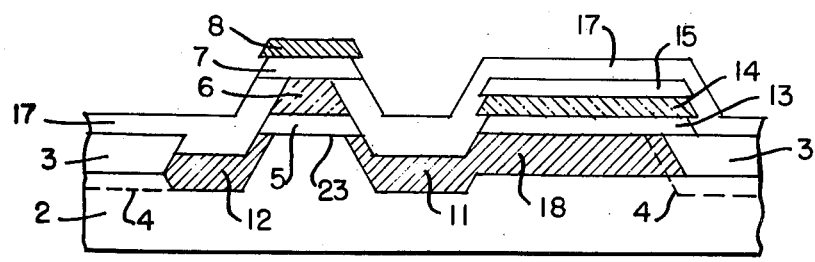
Figure 1I:
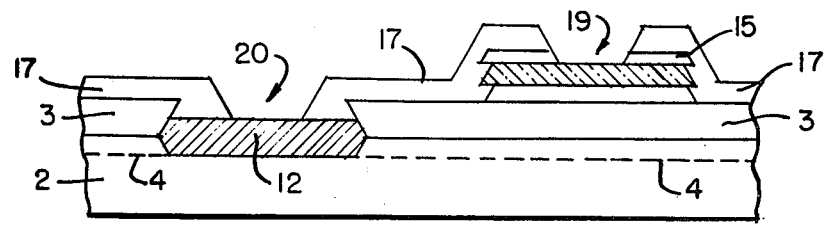
Figure 1J:
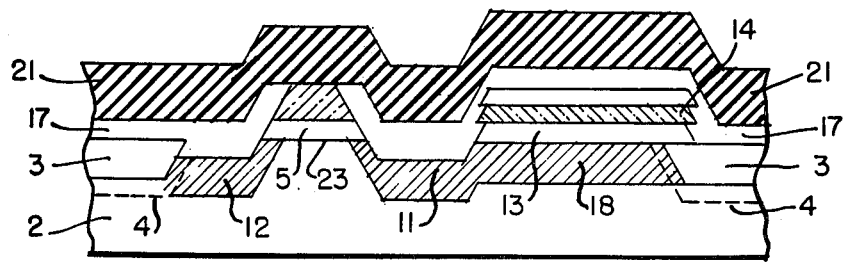

Next, a dielectric insulation layer 17 is formed above the polysilicon plate 14, and above the n-type source and drain regions, 11 and 12 respectively, not covered by polysilicon gates or polysilicon storage capacitor plates as shown in FIG. 1H. Formation of layer 17 also increases the thickness of the field oxide in those regions not covered by polysilicon plate 14. It is noted that the insulation layer 17 does not affect to any serious degree the n-type lower capacitor electrode 18 which is situated under polysilicon capacitor plate 14 as shown in FIG. 1H. Layer 17 electrically insulates the subsequently formed conductive line to the gate from the plate, and from the n-type source and drain regions. Layer 17 also decreases the capacitive coupling between the metallic interconnection line and the plate, source, drain and substrate. Accordingly, layer 17 should be as thick as possible, but not so thick as to cause degradation of or discontinuities in the conductive lines to any undesired extent, nor so thick that the polysilicon layer 14 is consumed during oxidation to any undesired extent.

The dielectric insulation 17 over the plate and n-type source and drain regions 11 and 12 is formed by growing a silicon dioxide layer 1500 to 5000 A thick by thermal oxidation at 1000° C in the presence of steam. During this oxidation about 600 to 2000 A of the 3500 A thick polysilicon plate is converted to silicon dioxide, and about 600 to 2000 A of the silicon substrate over the n-type source and drain regions is also converted to silicon dioxide. The n-type source and drain regions 11 and 12 are driven down into the substrate and laterally around the growing oxide as shown in FIG. 1H. Since the oxide tends to expel n-type dopants, the n-type dopant is not consumed to any significant extent during this oxidation. The top of the gate is protected from oxidation by an oxidation barrier layer 8, whereas the sides of the gate are subjected to the oxidation, which desirably provides protective insulation up to the non-oxidizing layer 8. During oxidation the thickness of the field oxide in those regions not covered by polysilicon layer 14 is advantageously increased by about 500 to 1500 A.

Next the gates are revealed. First, any part of layer 9 still remaining is now removed by a short time or "dip" etch in hydrofluoric acid. Next, the oxidation barrier layer 8 over the gates is removed by etching in a phosphoric acid solution at 180° C. Then, the thin oxide layer 7 is removed by dip etching in a buffered hydrofluoric acid solution.

Figure 2D:
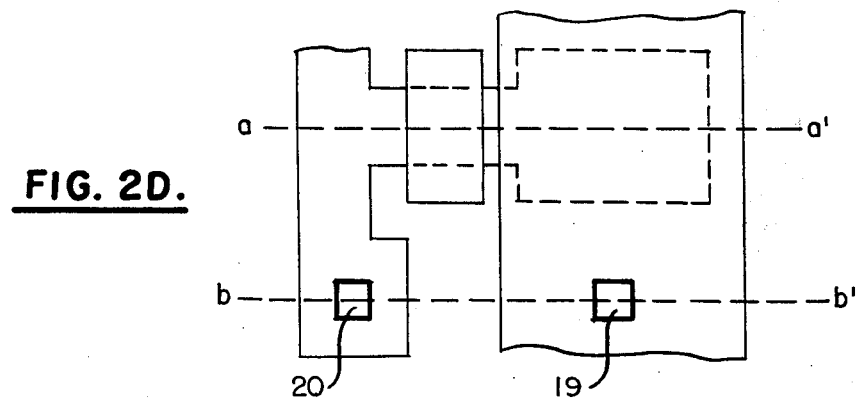

In fabricating FET integrated circuits, it is necessary to connect conductive lines to the upper capacitor electrode (plate) and to n-type source and drain regions. These connections do not occur in the array of memory cells, but are in the outer lying addressing, decoding, and sensing circuits referred to as peripheral circuits. This is done by applying a photoresist layer to the assembly. The resist material is exposed with UV radiation using a predetermined lithographic mask pattern shown in FIG. 2D, and the unexposed regions of the resist are dissolved away. This is the fourth basic lithographic masking step. Next, the structure is treated to remove the portions of the silicon dioxide not protected by the resist material. The wafer is immersed in a solution of buffered hydrofluoric acid to provide contact holes or vias 19 and 20 through the oxide insulation layer 17 to allow electrical connection to the polysilicon upper electrode 14, and to n-type drain region 12 as shown in FIG. 11. Source region 11 can, of course, be contacted in the above mentioned manner where desired. The remaining photoresist above the etched silicon dioxide is then removed by dissolving in a suitable solvent. Not the polysilicon gates, and the polysilicon plate regions and the n-type drain (or source) regions in the contact holes 19 and 20, respectively, have been revealed for contacting. It is noted that the sequence of removing nonoxidizing layer 8, and then etching contact holes 19 and 20 may be reversed without seriously affecting the final structure.

Next, the metallic-type highly-conductive interconnection line material 21, preferably a metal, is deposited and the interconnection pattern is delineated. An example of a highly-conductive material commonly used for interconnections is aluminum which may contain relatively small amounts of impurities introduced to decrease electromigration effects or to prevent or reduce chemical reactions between the aluminum and the semiconductive material to be contacted. The highly-conductive material such as aluminum may be deposited by sputtering or preferably by evaporation.

It is noted that a barrier layer (not shown) may be placed between the aluminum and the silicon or polysilicon semiconductive material to prevent or reduce chemical reaction between the aluminum and the semiconductive material. The barrier layer may be of a metal such as titanium or chromium, or of an intermetallic silicide such as platinum silicide or paladium silicide.

Figure 2E:
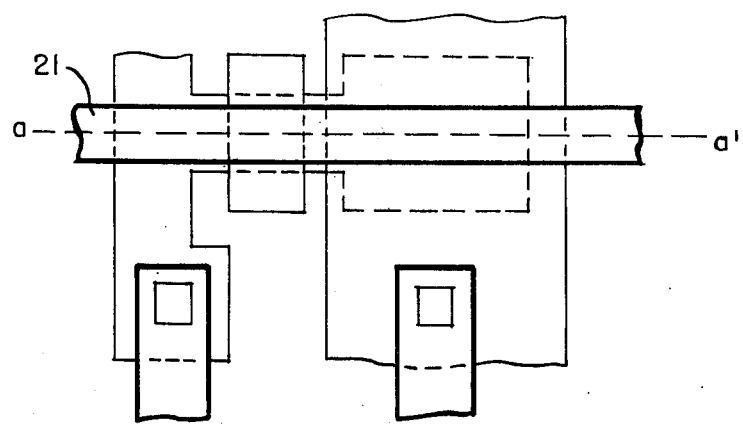

Next, a photoresist layer is applied to the assembly. The resist material is exposed with UV radiation using a predetermined mask pattern shown in FIG. 2E and the unexposed regions of the resist are dissolved away. This is the fifth basic lithographic masking step. Then the structure is treated to remove the portions of the conductive material not protected by the resist as illustrated in FIG. 2E. When a barrier layer is employed under the conductive material, the pattern in the conductive material can serve as an etching mask for delineating the barrier layer.

FIG. 2E illustrates a top view of an FET one-device memory cell and representative contact holes or vias to a doped bit line and to a polysilicon storage capacitor electrode fabriacted according to the present invention.

In other FET processes that use a conventional etched contact hole for connection between the metal word line and the polysilicon gate, extreme precision in registration between the contact hole lithographic mask and the polysilicon gate lithographic mask is required. Furthermore, since only that portion of the gate revealed by the hole is available for contacting, precise registration between the contact hole lithographic mask and the interconnection line lithographic mask is also required. In the "self-registering" gate contact method employed in the present invention, the entire polysilicon gate area is revealed for contacting and the conductive material need merely to cross over any portion of the polysilicon gate in order to make electrical connection. Accordingly, this misregistration tolerant aspect of the present invention considerably reduces the required degree of registration precision between the polysilicon gate lithographic mask and the interconnection line lithographic mask. Also, as known in the art, further layers (not shown) may be provided over the metallic-type layer 21 such as sputtered silicon dioxide for the purpose of passivating the integrated circuit. Furthermore as is known in the art, when desired, other masking steps may be used to provide vias through the passivation layer in order to make contact to the metallic interconnection layer or to the semiconductive substrate.

Figure 3A:
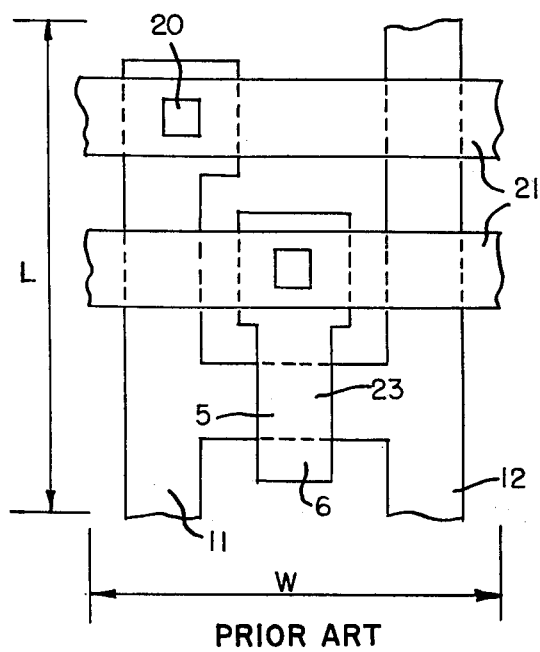
FIG. 3A and 3B shows two fragments of a peripheral circuit fabricated with a conventional etched contact hole through the insulation oxide between the metal word line and polysilicon gate (FIG. 3A), and with a self-registering metal line to polysilicon gate contact as employed in the present invention (FIG. 3B).
Figure 3B:
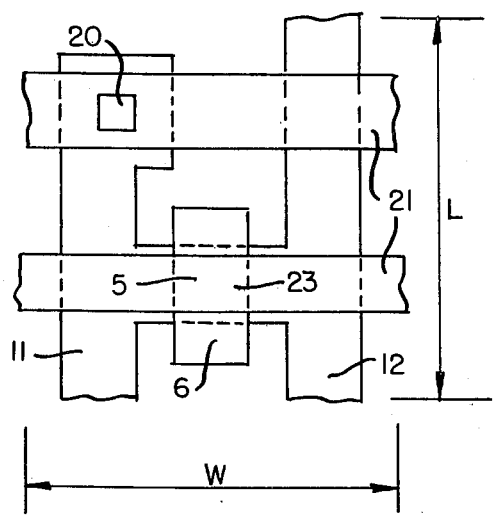

Yet another advantage of the present invention is that relatively smaller peripheral circuits may be fabricated with the "self-registered" gate contact technique than with conventional etched gate contact hole techniques. In FIG. 3A is shown a fragment of a peripheral circuit having a conventional etched contact hole to allow electrical connection between a metal interconnection line and a polysilicon gate. In FIG. 3B is shown a fragment of a peripheral circuit having a "self-registering" contact between a metal interconnection line and a polysilicon gate following the method of the present invvention. The fragments shown in FIGS. 3A and 3B provide the same electrical circuit function, but the fragment shown in FIG. 3B as employed in the present invention is smaller in both the length, L, and the width, W, dimensions. Four basic lithographic masking steps are required to fabricate the fragments shown in FIGS. 3A and 3B.

What is claimed is:

1. A method for fabricating an integrated circuit array of FET one-device memory cells having oxide isolation between cells, and each cell of the array having a doped bit line; polysilicon-gate FET self-aligned to source and drain regions; a metallic-type high-electrically conductive word line; a self-registering connection between the gate and the word line; and a charge storge capacitor with a polysilicon upper electrode and a doped silicon lower electrode beneath the polysilicon upper electrode, the lower electrode being doped opposite in conductivity type to the substrate doping, which comprises:

(A) providing a semiconductive substrate of a first conductive type containing active impurities of a first conductive type;

(B) providing and delineating predetermined oxide isolation regions above or recessed into the substrate to provide insulating field oxide regions between memory cells of the array;

(C) providing an insulator for the FET gates;

(D) depositing a layer of polycrystalline silicon above the gate insulator;

(E) then delineating the layer of polycrystalline silicon employing an oxidation barrier layer to provide the predetermined polycrystalline silicon gate regions of the FETs;

(F) thermally diffusing or ion implanting active impurities of a second and opposite conductive type into preselected regions of the semiconductive substrate to provide doped bit lines (FET drains); connection regions (FET sources); and lower silicon electrodes of the storage capacitors, above which electrodes, are to be subsequently delineated polycrystalline silicon upper electrodes of the storage capacitors;

(G) providing an insulator for the storage capacitors;

(H) then depositing a second and subsequent layer of polycrystalline silicon above the insulator for the storage capacitors;

(I) then delineating the second and subsequent layer of doped polycrystalline silicon to provide predetermined upper electrode regions above the corresponding doped lower silicon electrodes or the storage capacitors;

(J) thermally growing a silicon dioxide insulating layer over regions of the structure but not over the polycrystalline silicon FET gates which are still protected by an oxidation barrier layer;

(K) removing the oxidation barrier layer from over the FET gates by use of an etchant;

(L) delineating contact holes to polycrystalline silicon upper capacitor electrodes; and to doped sources and drains in circuits peripheral to the array of memory cells;

(M) depositing and delineating a metallic-type high-conductivity electrical interconnection pattern that makes electrical connection to the polycrystalline silicon FET gates in the array of memory cells; to polycrystalline silicon upper capacitor electrodes; and to FET gates, sources, and drains in circuits peripheral to the array of memory cells.

2. The method of claim 1 wherein said semiconductive substrate is a p-type silicon substrate containing active p-type impurities.

3. The method of claim 2 wherein said p-type impurities are selected from the group consisting of boron, aluminum, gallium, and indium.

4. The method of claim 1 wherein said insulating field oxide regions are of silicon dioxide.

5. The method of claim 4 wherein said field oxide regions are about 4000 to about 10,000 A in thickness.

6. The method of claim 1 wherein said insulating field oxide regions are recessed into the semiconductive substrate.

7. The method of claim 1 wherein said gate insulator is a layer of silicon dioxide.

8. The method of claim 7 wherein said silicon dioxide gate insulator is about 200 to about 1000 A in thickness.

9. The method of claim 1 wherein said layer of polycrystalline silicon FET gate regions is about 1500 to about 5000 A in thickness.

10. The method of claim 1 wherein said polycrystalline silicon FET gate layer is of a second conductive type.

11. The method of claim 1 wherein said active impurities of a second conductive type are an n-type dopant.

12. The method of claim 11 wherein said n-type dopant is arsenic, phosphorus or antimony.

13. The method of claim 1 wherein said oxidation barrier layer in step (E) is of silicon nitride.

14. The method of claim 13 wherein said oxidation nitride layer is about 500 to about 1000 A in thickness.

15. The method of claim 1 wherein said capacitor insulator in a layer of silicon dioxide.

16. The method of claim 15 wherein said capacitor insulator is about 200 to about 1000 A in thickness.

17. The method of claim 1 wherein said second and subsequent layer of polycrystalline silicon is about 3500 to about 5000 A in thickness.

18. The method of claim 17 wherein said second and subsequent layer of polycrystalline silicon is of a second conductive type.

19. The method of claim 1 wherein said silicon dioxide insulating layer grown in step (J) is about 1500 to about 5000 A in thickness.

20. The method of claim 1 wherein said interconnection pattern is of metal.

21. The method of claim 20 wherein said metal is aluminum.

22. The method of claim 21 which further includes providing a barrier layer between said aluminum and said silicon or polycrystalline silicon to at least reduce chemical reaction therebetween.

23. The method of claim 22 wherein said chemical reaction barrier layer is a metal other than aluminum, or an intermetallic silicide.

24. The method of claim 23 wherein said chemical reaction barrier layer is of titanium or chromium.

25. The method of claim 23 wherein said chemical reaction barrier layer is of platinum silicide or palladium silicide.

* * * * *

UNITED STATES PATENT AND TRADEMARK OFFICE
CERTIFICATE OF CORRECTION

PATENT NO. : 4,075,045
DATED : February 21, 1978
INVENTOR(S) : Vincent L. Rideout It is certified that error appears in the above—identified patent and that said Letters Patent is hereby corrected as shown below:

In the last line of the title, "DELIBERATING" should read -- DELINEATING --.

Column 10, line 43, "pattrn" should read -- pattern --.

Column 12, line 25, "Not" should read -- Now --.

Claim 14, line 2, "nitride" should read -- barrier --.

Claim 15, line 2, "in" should read -- is --.

Signed and Sealed this

Nineteenth Day of February 1980

[SEAL]

Attest:

SIDNEY A. DIAMOND

Attesting Officer

Commissioner of Patents and Trademarks